(12) United States Patent
Huang et al.

(10) Patent No.: US 10,418,305 B2
(45) Date of Patent: Sep. 17, 2019

(54) CHIP ON FILM PACKAGE

(71) Applicant: Novatek Microelectronics Corp., Hsinchu (TW)

(72) Inventors: Wen-Ching Huang, Hsinchu (TW); Chien-Chen Ko, Hsinchu (TW); Ling-Chieh Li, Hsinchu County (TW)

(73) Assignee: Novatek Microelectronics Corp., Hsinchu (TW)

(*) Notice: Subject to any disclaimer, the term of this patent is extended or adjusted under 35 U.S.C. 154(b) by 0 days.

(21) Appl. No.: 16/261,607

(22) Filed: Jan. 30, 2019

(65) Prior Publication Data

US 2019/0198417 A1 Jun. 27, 2019

Related U.S. Application Data

(63) Continuation-in-part of application No. 15/903,044, filed on Feb. 23, 2018, now Pat. No. 10,236,234.

(Continued)

(51) Int. Cl.

| | |
|---|---|
| *H01L 23/373* | (2006.01) |
| *B32B 7/12* | (2006.01) |
| *B32B 37/14* | (2006.01) |
| *H01L 23/367* | (2006.01) |
| *B32B 9/00* | (2006.01) |
| *H01L 23/31* | (2006.01) |
| *H01L 23/00* | (2006.01) |

(Continued)

(52) U.S. Cl.
CPC .............. *H01L 23/373* (2013.01); *B32B 7/12* (2013.01); *B32B 9/007* (2013.01); *B32B 37/12* (2013.01); *B32B 37/14* (2013.01); *H01L 21/481* (2013.01); *H01L 23/315* (2013.01); *H01L 23/3142* (2013.01); *H01L 23/367* (2013.01); *H01L 23/49838* (2013.01); *H01L 24/32* (2013.01); *H01L 24/83* (2013.01); *B32B 2457/00* (2013.01); *H01L 2224/32225* (2013.01)

(58) Field of Classification Search
CPC . H01L 23/373; H01L 21/481; H01L 23/3142; H01L 23/315; H01L 24/32; H01L 23/367; H01L 23/49838; H01L 24/83; H01L 2224/32225; B32B 37/12; B32B 9/007; B32B 7/12; B32B 37/14; B32B 2457/00
See application file for complete search history.

(56) References Cited

U.S. PATENT DOCUMENTS

2014/0124907 A1* 5/2014 Park .................. H01L 23/552
257/659

* cited by examiner

*Primary Examiner* — Kyoung Lee
(74) *Attorney, Agent, or Firm* — JCIPRNET

(57) ABSTRACT

A chip on film package includes a base film, a patterned circuit layer, a chip and a heat dissipation sheet. The base film includes a first surface and a mounting region located on the first surface. The patterned circuit layer is disposed on the first surface. The chip is disposed on the mounting region and electrically connected to the patterned circuit layer. The heat dissipation sheet includes a first adhesive layer disposed over the base film, a second adhesive layer disposed over the first adhesive layer, and a graphite layer disposed between the first adhesive layer and the second adhesive layer, wherein at least one of the first adhesive layer and the second adhesive layer is a double-sided adhesive with carrier, which comprises two adhesives and a carrier disposed between the two adhesives.

30 Claims, 8 Drawing Sheets

Related U.S. Application Data which is a continuation of application No. 15/613,275, filed on Jun. 5, 2017, now Pat. No. 10,079,194.

(60) Provisional application No. 62/468,340, filed on Mar. 7, 2017, provisional application No. 62/687,763, filed on Jun. 20, 2018.

(51) Int. Cl.
*H01L 21/48* (2006.01)
*B32B 37/12* (2006.01)
*H01L 23/498* (2006.01)

CHIP ON FILM PACKAGE

CROSS-REFERENCE TO RELATED APPLICATION

This is a continuation-in-part application of patent application Ser. No. 15/903,044, filed on Feb. 23, 2018, now allowed. The prior U.S. application Ser. No. 15/903,044 is a continuation application of and claims the priority benefit of U.S. application Ser. No. 15/613,275, filed on Jun. 5, 2017, now U.S. Pat. No. 10,079,194B1, issued on Sep. 18, 2018, which claims the priority benefit of U.S. provisional application Ser. No. 62/468,340, filed on Mar. 7, 2017. The application also claims the priority benefit of U.S. provisional application Ser. No. 62/687,763, filed on Jun. 20, 2018. The entirety of each of the above-mentioned patent applications is hereby incorporated by reference herein and made a part of this specification.

BACKGROUND

Technical Field

The present disclosure generally relates to a chip package. More particularly, the present disclosure relates to a chip on film package.

Description of Related Art

In semiconductor production, the manufacturing of integrated circuits (IC) can be divided into three different stages, namely, a wafer fabrication stage, an integrated circuit fabrication stage and an IC packaging stage such as applying a chip-on-film (COF) package.

To increase the dissipation of heat from a chip of a COF package, a heat dissipation sheet is normally attached to a top surface of the base film to cover the whole chip or attached to a bottom surface of the base film opposite to the chip using thermal conductive glue after the chip is electrically connected to the film via bumps. Conventionally, during the process of attaching the heat dissipation sheet on the film for covering the chip, it is hard to make the heat dissipation sheet and the chip tightly attached together, so air gap usually exists between the chip and the heat dissipation sheet. As such, the air trapped between the chip and the heat dissipation sheet would expand during the subsequent thermal process, which may cause the heat dissipation sheet separating from the chip and reduce the reliability of the chip package. Moreover, since the heat conductivity of air is rather low, the air trapped in the space between the chip and the heat dissipation sheet would also affect the efficiency for heat generated from the chip to be conducted to the heat dissipation sheet.

SUMMARY

Accordingly, the present disclosure is directed to a chip on film package with favourable heat dissipation efficiency.

The present disclosure provides a chip on film package includes a base film, a patterned circuit layer, a chip and a heat dissipation sheet. The base film includes a first surface and a mounting region located on the first surface. The patterned circuit layer is disposed on the first surface. The chip is disposed on the mounting region and electrically connected to the patterned circuit layer. The heat dissipation sheet includes a first adhesive layer disposed over the base film, a second adhesive layer disposed over the first adhesive layer, and a graphite layer disposed between the first adhesive layer and the second adhesive layer, wherein at least one of the first adhesive layer and the second adhesive layer is a double-sided adhesive with carrier, which comprises two adhesives and a carrier disposed between the two adhesives.

According to an embodiment of the present disclosure, each of the first adhesive layer and the second adhesive layer is a double-sided adhesive with carrier.

According to an embodiment of the present disclosure, the first adhesive layer is a double-sided adhesive with carrier, and the second adhesive layer is a double-sided adhesive without carrier, wherein the double-sided adhesive without carrier comprises an adhesive without comprising any carrier.

According to an embodiment of the present disclosure, the first adhesive layer is a double-sided adhesive without carrier, and the second adhesive layer is a double-sided adhesive with carrier, wherein the double-sided adhesive without carrier comprises an adhesive without comprising any carrier.

According to an embodiment of the present disclosure, a material of the two adhesives comprises high temperature acrylic adhesive.

According to an embodiment of the present disclosure, a material of the carrier comprises polyethylene terephthalate (PET) or polyimide (PI).

According to an embodiment of the present disclosure, a material of the adhesive comprises high temperature acrylic adhesive.

According to an embodiment of the present disclosure, a material of the adhesive comprises high temperature acrylic adhesive.

According to an embodiment of the present disclosure, the heat dissipation sheet further comprises a protection layer disposed on the second adhesive layer.

According to an embodiment of the present disclosure, the protection layer is an insulating film.

According to an embodiment of the present disclosure, a material of the insulating film comprises polyimide (PI).

According to an embodiment of the present disclosure, a thickness of the heat dissipation sheet substantially ranges from 17 μm to 20 μm.

According to an embodiment of the present disclosure, wherein the chip on film package further includes a solder resist layer partially covering the patterned circuit layer and disposed between the patterned circuit layer and the heat dissipation sheet.

According to an embodiment of the present disclosure, the heat dissipation sheet covers at least a part of the solder resist layer and an outer edge of the heat dissipation sheet is substantially aligned with an outer edge of the solder resist layer.

According to an embodiment of the present disclosure, the heat dissipation sheet is attached to the solder resist layer by the first adhesive layer.

According to an embodiment of the present disclosure, the heat dissipation sheet further comprises an opening exposing at least a part of the chip.

According to an embodiment of the present disclosure, the opening completely exposes an upper surface and a plurality of side surfaces of the chip.

According to an embodiment of the present disclosure, the heat dissipation sheet covers at least a part of an upper surface of the chip and the opening completely exposes two side surfaces of the chip.

According to an embodiment of the present disclosure, the opening exposes at least a part of a plurality of side surfaces of the chip.

According to an embodiment of the present disclosure, the opening exposes at least a part of two short side surfaces of the chip.

According to an embodiment of the present disclosure, the opening exposes at least a part of two long side surfaces of the chip.

According to an embodiment of the present disclosure, the heat dissipation sheet layer completely covers an upper surface of the chip.

According to an embodiment of the present disclosure, the opening completely exposes an upper surface of the chip.

According to an embodiment of the present disclosure, the opening of the heat dissipation sheet exposes a part of the patterned circuit layer extended to the mounting region.

According to an embodiment of the present disclosure, the chip on film package further includes an underfill filled between the chip and the base film, and the opening exposing the underfill.

According to an embodiment of the present disclosure, a gap exists between the opening and a side surface of the chip.

According to an embodiment of the present disclosure, a width of the gap is equal to or longer than 2 mm.

According to an embodiment of the present disclosure, the chip on film package further includes a back heat dissipation sheet disposed on a second surface of the base film opposite to the first surface of the base film.

According to an embodiment of the present disclosure, the back heat dissipation sheet is overlapped with at least the mounting region from a top view of the chip on film package.

According to an embodiment of the present disclosure, an outer edge of the back heat dissipation sheet is substantially aligned with the outer edge of the heat dissipation sheet.

In light of the foregoing, the heat dissipation sheet is disposed over the base film of the chip on film package of the disclosure, wherein the heat dissipation sheet includes a graphite layer disposed between two adhesive layers, and at least one of the two adhesive layers is a double-sided adhesive with carrier. With such configuration, heat dissipation sheet provides not only heat dissipation functions but also support to the chip on film package, and the contact area between the heat dissipation sheet and the chip on film package can be maximizing, so as to improve the heat dissipation and reliability of the chip on film package.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
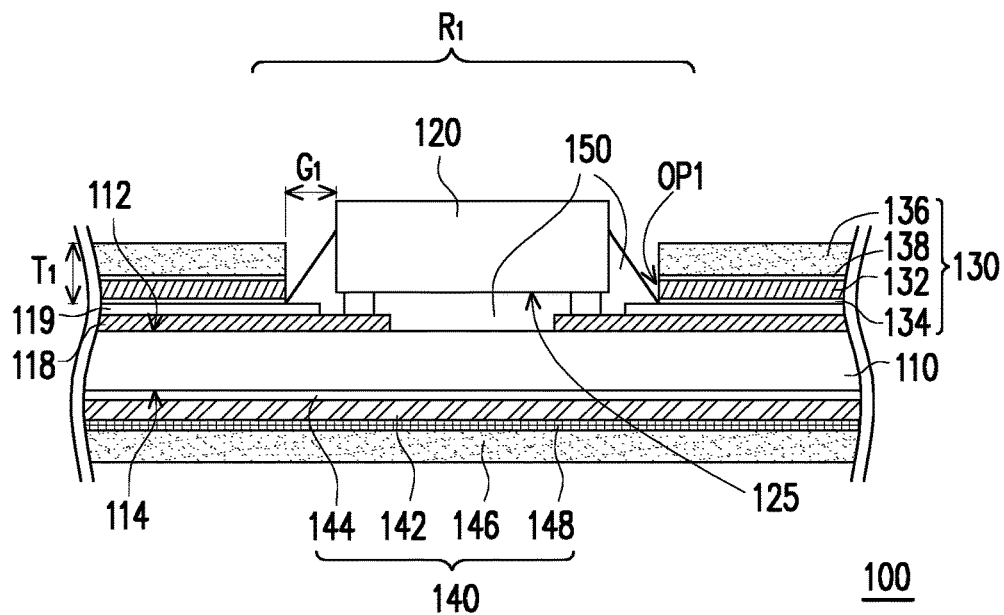
FIG. 1 illustrates a cross-sectional view of a chip on film package according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Figure 2:
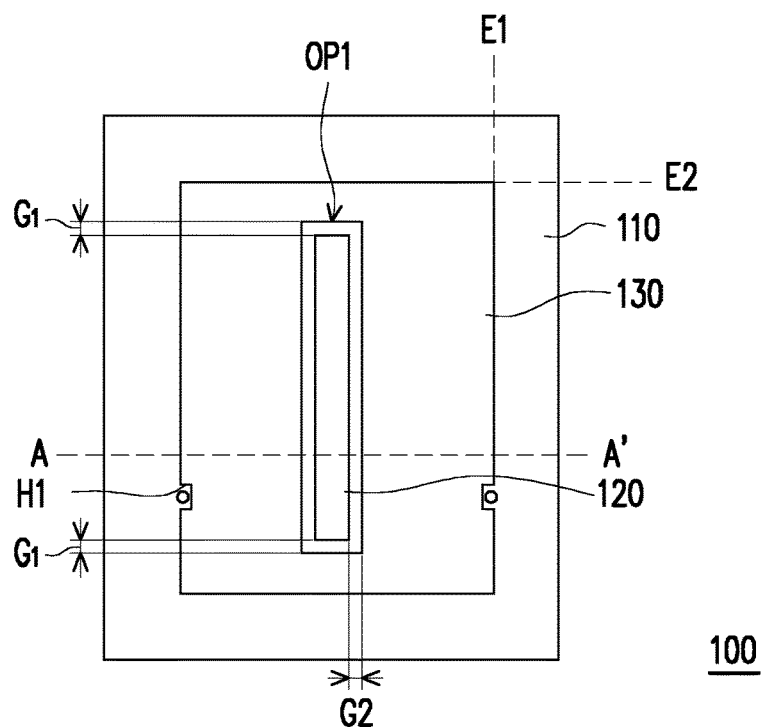
FIG. 2 illustrates a top view of a chip on film package according to an embodiment of the disclosure.

FIG. 1 illustrates a cross-sectional view of a chip on film package according to an embodiment of the disclosure. FIG. 2 illustrates a top view of a chip on film package according to an embodiment of the disclosure. It is noted that FIG. 1 is the cross-sectional view of FIG. 2 along line A-A'. Referring to FIG. 1 and FIG. 2, in the present embodiment, a chip on film package 100 includes a base film 110, a patterned circuit layer 118, a solder resist layer 119, a chip 120 and a heat dissipation sheet 130. The base film 110 includes a first surface 112. A mounting region R1 is where the chip 120 is mounted and is located on the first surface 112. The patterned circuit layer 118 is disposed on the first surface 112 of the base film 110. The solder resist layer 119 partially covers the patterned circuit layer 118. The chip 120 is disposed in the mounting region R1 and electrically connected to the patterned circuit layer 118.

In more detail, for example, as shown in the present embodiment, the solder resist layer 119 covers the patterned circuit layer 118 and exposes a part of the patterned circuit layer 118, such that the chip 120 is electrically connected to the part of the patterned circuit layer 118 exposed by the solder resist layer 119. In the present embodiment, the patterned circuit layer 118 is extended to the mounting region R1 and the solder resist layer 119 exposes a part of the patterned circuit layer 118 extended to the mounting region R1 as shown in FIG. 1. The chip 120 is mounted on the part of the patterned circuit layer 118 extended to the mounting region R1.

Moreover, the heat dissipation sheet 130 covers at least a part of the solder resist layer 119. Advantageously, the heat dissipation sheet 130 may have a soft texture and good thermal conductivity, allowing the area of heat dissipation to be increased and therefore leading to an improved heat dissipation effect. Preferably but not limitedly, an outer edge E1/E2 of the heat dissipation sheet 130 can be arranged to be substantially aligned with an outer edge of the solder resist layer 119. For example, a distance between the outer edge E1/E2 of the heat dissipation sheet 130 and the outer edge of the solder resist layer 119 is equal to or smaller than 1 mm.

In some implementations as shown in the present embodiment, the heat dissipation sheet 130 may include a plurality of alignment holes H1 for aligning the outer edge E1/E2 of the heat dissipation sheet 130 with the outer edge of the solder resist layer 119. The alignment holes H1 can be any shape according to desired or required of designs. Preferably but not limitedly, the sizes of the holes H1 may be arranged to be smaller than 3 mm to maximize the heat dissipation effect of the heat dissipation sheet 130.

In the present embodiment, after the packaging process is done, the package structure may be cut along a plurality of cutting lines, which may be aligned with the outer edge E1/E2 of the solder resist layer 119, to form a plurality of chip on film packages 100. With the arrangement of the outer edge E1/E2 of the heat dissipation sheet 130 being aligned with the outer edge of the solder resist layer 119, the contact area between the heat dissipation sheet 130 and the solder resist layer 119/the chip 120 can be maximized, which can improve the heat dissipation of the chip on film package 100.

In general, if the heat-dissipation layer covers the chip completely, the heat-dissipation layer might deform or even separate from the chip under high temperature and/or high humidity condition due to the expansion of the air and/or moisture trapped between the chip and the heat-dissipation layer. As such, in some implementations as shown in the present embodiment, the heat dissipation sheet 130 may further include one or more openings OP1 exposing at least a part of the chip 120 and the part of the patterned circuit layer 118 extended to the mounting region R1. With such a configuration, the air and/or moisture trapped between the chip 120 and the heat dissipation sheet 130 may be more easily discharged through the opening OP1 so as to avoid unwanted deformation or separation of the heat dissipation sheet 130. Thereby, the reliability of the chip on film package 100 can be improved.

In the present embodiment, the opening OP1 may completely expose an upper surface and a plurality of side surfaces of the chip 120 as shown in FIG. 1 and FIG. 2, but the disclosure is not limited thereto. In addition, the chip on film package 100 may further include an underfill 150 filled between the chip 120 and the base film 110. The underfill 150 may be further filled between a side surface of the chip 120 and a side surface of the heat dissipation sheet 130 exposed by the opening OP1 as shown in FIG. 1. In the present embodiment, one or more gap G1/G2 exist between a side surface of the heat dissipation sheet 130/the opening OP1 and a side surface of the chip 120. For example, the gap G1 may exist between a side surface of the heat dissipation sheet 130/the opening OP1 and a short side surface of the chip 120, and the gap G2 may exist between another side surface of the heat dissipation sheet 130/the opening OP1 and a long side surface of the chip 120 as shown in FIG. 2. Preferably but not limitedly, a width of the gap G1/G2 can be arranged to be substantially equal to or longer than 2 mm. Moreover, it is noted that the width of the gap G1 may be substantially the same as or different from the width of the gap G2.

It is noted that in the present embodiment, the heat dissipation sheet 130 exposes an upper surface and a plurality of side surfaces (e.g. four side surfaces) of the chip 120, which means that none of the upper surface and the side surfaces of the chip 120 is completely covered, but the disclosure is not limited thereto. For example, in some other embodiments, the heat dissipation sheet 130 partially or completely covers the upper surface of the chip, while completely exposes the side surfaces of the chip 120. Moreover, in some other embodiments, the heat dissipation sheet 130 partially or completely covers the upper surface of the chip and two short/long side surfaces, while completely exposes two long/short side surfaces of the chip 120. Furthermore, in some yet other embodiments, the heat dissipation sheet 130 completely or partially covers each of an upper surface and the side surfaces of the chip 120, which means that none of the upper surface and the side surfaces of the chip 120 is completely exposed. More other different combinations of exposure or coverage of the heat dissipation sheet on the upper surface and side surfaces of the chip 120 can be implemented as required and is not limited in the disclosure.

Figure 3:
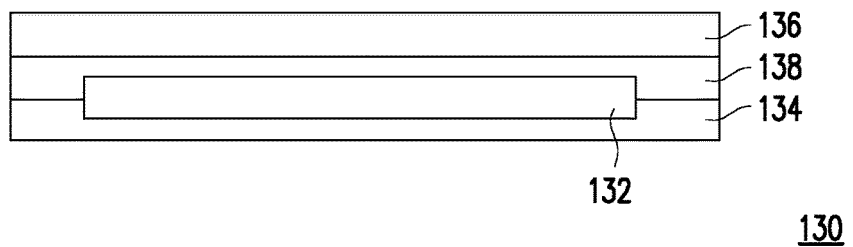
FIG. 3 illustrates a cross-sectional view of a heat dissipation sheet according to an embodiment of the disclosure.
Figure 4:
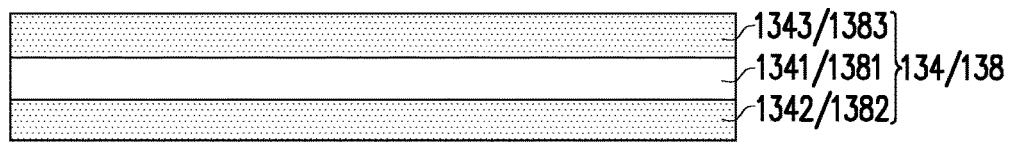
FIG. 4 illustrates a cross-sectional view of an adhesive layer of the heat dissipation sheet according to an embodiment of the disclosure.

FIG. 3 illustrates a cross-sectional view of a heat dissipation sheet according to an embodiment of the disclosure. FIG. 4 illustrates a cross-sectional view of an adhesive layer of the heat dissipation sheet according to an embodiment of the disclosure. With now reference to FIG. 3 and FIG. 4, in some embodiments, the heat dissipation sheet 130 is disposed over the base film 110. Specifically, the heat dissipation sheet 130 may be attached to the solder resist layer 119 (and may be a part of the chip 120) on the base film 110. In detail, the heat dissipation sheet 130 may include a graphite layer 132, a first adhesive layer 134, a second adhesive layer 138 and a protection layer 136 as shown in FIG. 3. In addition, the structure shown in FIG. 3 can be applied to FIG. 1 or other embodiments in the disclosure but not limited thereto. In some embodiments, the first adhesive layer 134 is disposed over the base film 110. The second adhesive layer 138 is disposed over the first adhesive layer 134, and the graphite layer 132 is disposed between the first adhesive layer 134 and the second adhesive layer 138. In other words, the graphite layer 132 may be attached to the base film 110 (and the chip 120) by the first adhesive layer 134. The protection layer 136 can be attached to the graphite layer 132 by the second adhesive layer 138.

In some embodiments, at least one of the first adhesive layer 134 and the second adhesive layer 136 is a double-sided adhesive with carrier. Herein, the double-sided adhesive with carrier may include two adhesives 1342/1382, 1343/1383 and a carrier 1341/1381 disposed between the two adhesives 1342/1382, 1343/1383.

Figure 5A:
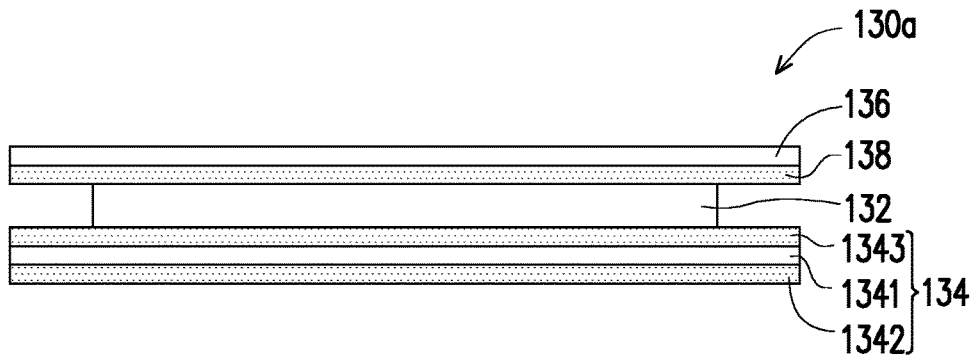
FIG. 5A to FIG. 5B illustrate cross-sectional views of heat dissipation sheets according to some embodiments of the disclosure.

FIG. 5A illustrates a cross-sectional view of a heat dissipation sheet according to an embodiment of the disclosure. With now reference to FIG. 5A, in one of the exemplary embodiments, preferably but not limitedly, the first adhesive layer 134 of the heat dissipation sheet 130a is the double-sided adhesive with carrier, and the second adhesive layer 138 of the heat dissipation sheet 130a is a double-sided adhesive without carrier. Herein, the double-sided adhesive without carrier may include an adhesive 138 without having any carrier. In detail, the first adhesive layer 134 may include two adhesives 1342, 1343, and a carrier 1341 disposed between the two adhesives 1342, 1343. In some embodiments, a material of the two adhesives 1342, 1343 and the adhesive 138 may include, for example but not limited thereto, a high temperature acrylic adhesive. A material of the carrier 1341 may include, for example but not limited thereto, polyethylene terephthalate (PET) or polyimide (PI). The protection layer 136 may include an insulating film such as a polyimide (PI) film, but the embodiment is merely for illustration and the disclosure does not limit the materials of the first adhesive layer 134, the second adhesive layer 138 and the protection layer 136.

In one of the embodiments, the first adhesive layer 134 may be a 3M™ adhesive layer (for example, 3M 8003), which may include two adhesives (i.e. adhesives 1342/1343) and a PET layer (i.e. carrier 1341) disposed therebetween. In alternative embodiments, the first adhesive layer 134 may be a combined structure of two PI tapes, which may include two PI tapes (i.e. adhesives 1342/1343) such as 3M 9461P, and a PI layer (i.e. carrier 1341) disposed therebetween. Owing to the characteristic of high heat endurance of PI, peeling of the graphite layer 132 due to high temperature may be avoided or at least reduced.

Figure 5B:
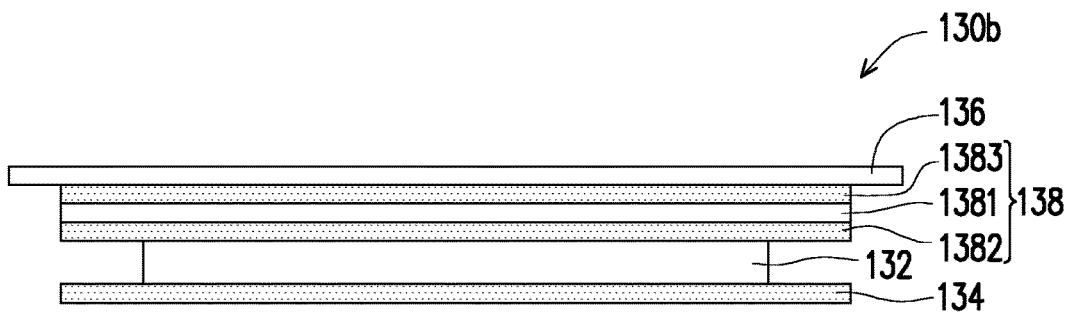

FIG. 5B illustrates a cross-sectional view of a heat dissipation sheet according to another embodiments of the disclosure. It is noted that the heat dissipation sheet 130b shown in FIG. 5B contains many features same as or similar to the heat dissipation sheet 130a disclosed earlier with FIG. 5A. For purpose of clarity and simplicity, detail description of same or similar features may be omitted, and the same or similar reference numbers denote the same or like components. The main differences between the heat dissipation sheet 130b shown in FIG. 5B and the heat dissipation sheet 130a shown in FIG. 5A are described as follows.

With now reference to FIG. 5B, in one of the exemplary embodiments, the first adhesive layer 134 of the heat dissipation sheet 130b is a double-sided adhesive without carrier, and the second adhesive layer 138 of the heat dissipation sheet 130a is a double-sided adhesive with carrier. Herein, the double-sided adhesive without carrier may include an adhesive 134 without having any carrier. In detail, the second adhesive layer 138 may include two adhesives 1382, 1383, and a carrier 1381 disposed between the two adhesives 1382, 1383. In some embodiments, a material of the two adhesives 1382, 1383 and the adhesive 134 may include, for example but not limited thereto, a high temperature acrylic adhesive. A material of the carrier 1381 may include, for example but not limited thereto, polyethylene terephthalate (PET) or polyimide (PI). The protection layer 136 may include an insulating film such as a polyimide (PI) film, but the embodiment is merely for illustration and the disclosure does not limit the materials of the first adhesive layer 134, the second adhesive layer 138 and the protection layer 136.

In one of the embodiments, the second adhesive layer 138 may be a 3M™ adhesive layer (for example, 3M 8003), which may include two adhesives (i.e. adhesives 1382, 1383) and a PET layer (i.e. carrier 1381) disposed therebetween. In alternative embodiments, the second adhesive layer 138 may be a combined structure of two PI tapes, which may include two PI tapes (i.e. adhesives 1382/1383) such as 3M 9461P, and a PI layer (i.e. carrier 1381) disposed therebetween. Owing to the characteristic of high heat endurance of PI, peeling of the graphite layer 132 due to high temperature may be avoided or at least reduced.

Figure 6:
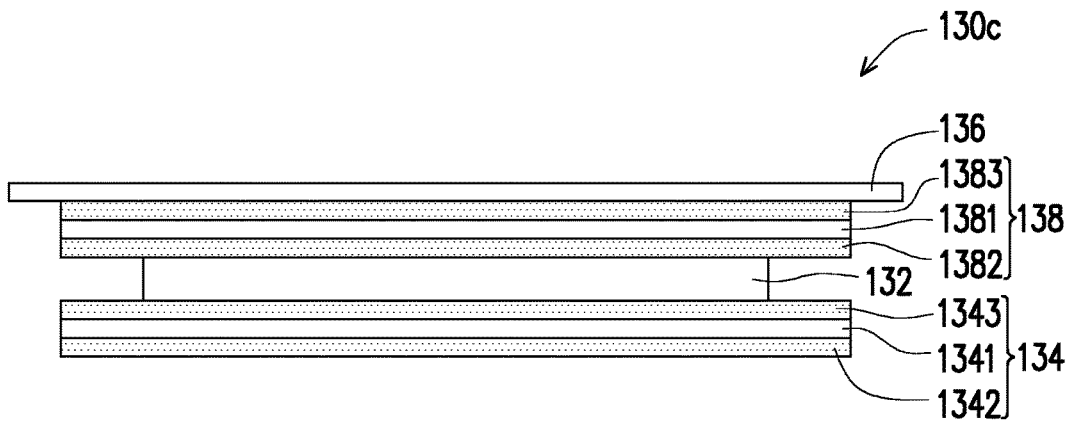
FIG. 6 illustrates a cross-sectional view of a heat dissipation sheet according to an embodiment of the disclosure.

FIG. 6 illustrates a cross-sectional view of a heat dissipation sheet according to another embodiments of the disclosure. It is noted that the heat dissipation sheet 130c shown in FIG. 6 contains many features same as or similar to the heat dissipation sheet 130a disclosed earlier with FIG. 5A. For purpose of clarity and simplicity, detail description of same or similar features may be omitted, and the same or similar reference numbers denote the same or like components. The main differences between the heat dissipation sheet 130c shown in FIG. 6 and the heat dissipation sheet 130a shown in FIG. 5A are described as follows.

With now reference to FIG. 6, in one of the exemplary embodiments, each of the first adhesive layer 134 and the second adhesive layer 138 is a double-sided adhesive with carrier. In detail, the first adhesive layer 134 may include two adhesives 1342, 1343, and a carrier 1341 disposed between the two adhesives 1342, 1343. Similarly, the second adhesive layer 138 may include two adhesives 1382, 1383, and a carrier 1381 disposed between the two adhesives 1382, 1383. In some embodiments, a material of each of the adhesives 1342, 1343, 1382, 1383 may include, for example but not limited thereto, a high temperature acrylic adhesive. A material of the carriers 1341, 1381 may include, for example but not limited thereto, polyethylene terephthalate (PET) or polyimide (PI). The protection layer 136 may include an insulating film such as a polyimide (PI) film, but the embodiment is merely for illustration and the disclosure does not limit the materials of the first adhesive layer 134, the second adhesive layer 138 and the protection layer 136.

In one of the embodiments, each of the first adhesive layer 134 and the second adhesive layer 138 may be a 3M™ adhesive layer (for example, 3M 8003), which may include two adhesives (e.g. adhesives 1342, 1343 and/or adhesives 1382, 1383) and a PET layer (e.g. carrier 1341 and/or carrier 1381) disposed therebetween. In alternative embodiments, each of the first adhesive layer 134 and the second adhesive layer 138 may be a combined structure of two PI tapes, which may include two PI tapes (e.g. adhesives 1342, 1343 and/or adhesives 1382, 1383) such as 3M 9461P, and a PI layer (e.g. carrier 1341 and/or carrier 1381) disposed therebetween. Owing to the characteristic of high heat endurance of PI, peeling of the graphite layer 132 due to high temperature may be avoided or at least reduced. In some implementations, a thickness (e.g. the thickness T1 shown in FIG. 1) of the heat dissipation sheet 130/130a/130b/130c may substantially range from 17 μm to 20 μm but not limited thereto.

In some implementations as exemplarily shown in the embodiment of FIG. 1, the chip on film package 100 further includes a back heat dissipation sheet 140 disposed on a second surface 114 of the base film 110 opposite to the first surface 112 of the base film 110. The back heat dissipation sheet 140 is overlapped with at least the mounting region R1 along a normal direction of the base film 110. The back heat dissipation sheet 140 may also include a graphite layer 142, a first adhesive layer 144, a second adhesive layer 148 and a protection layer 146 as shown in FIG. 1. The graphite layer 142 is attached to the second surface 114 of the base film 110 by the first adhesive layer 144. The protection layer 146 is attached to the graphite layer 142 by the second adhesive layer 148. Advantageously, an outer edge of the back heat dissipation sheet 140 can be arranged to be substantially aligned with the outer edge of the solder resist layer 119, so as to maximizing the contact area between the back heat dissipation sheet 140 and the base film 110, and further enhance the heat dissipation of the chip on film package 100. It is noted that the first adhesive layer 144 may have the same structure as the first adhesive layer 134 shown in FIG. 5A, FIG. 5B or FIG. 6. Similarly, the second adhesive layer 148 may have the same structure as the first adhesive layer 138 shown in FIG. 5A, FIG. 5B or FIG. 6. The disclosure is not limited thereto.

Figure 7:
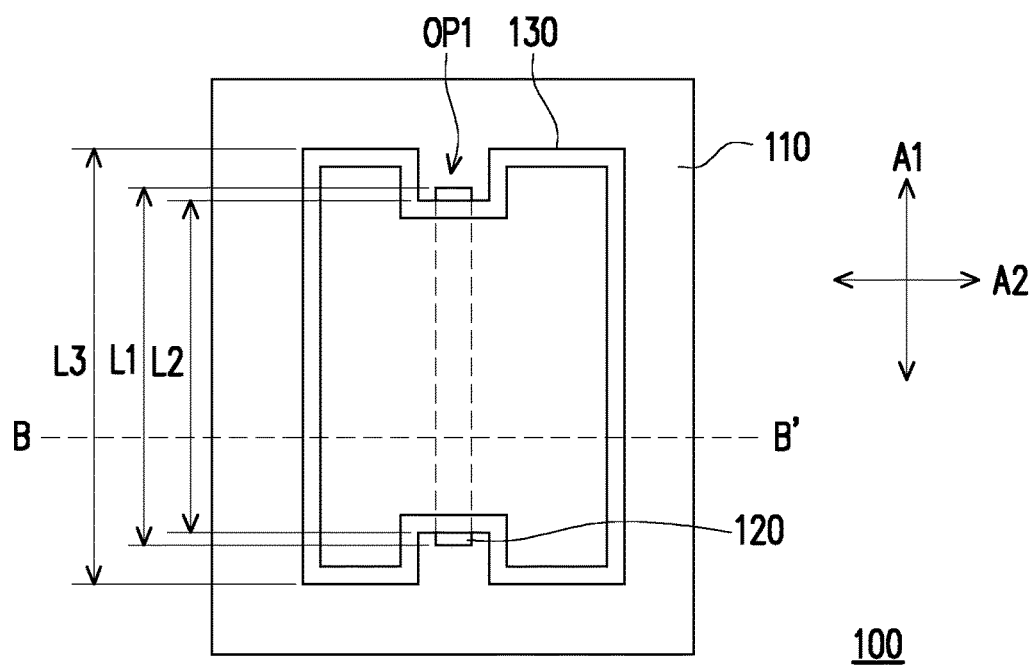
FIG. 7 illustrates a top view of a chip on film package according to an embodiment of the disclosure.
Figure 8:
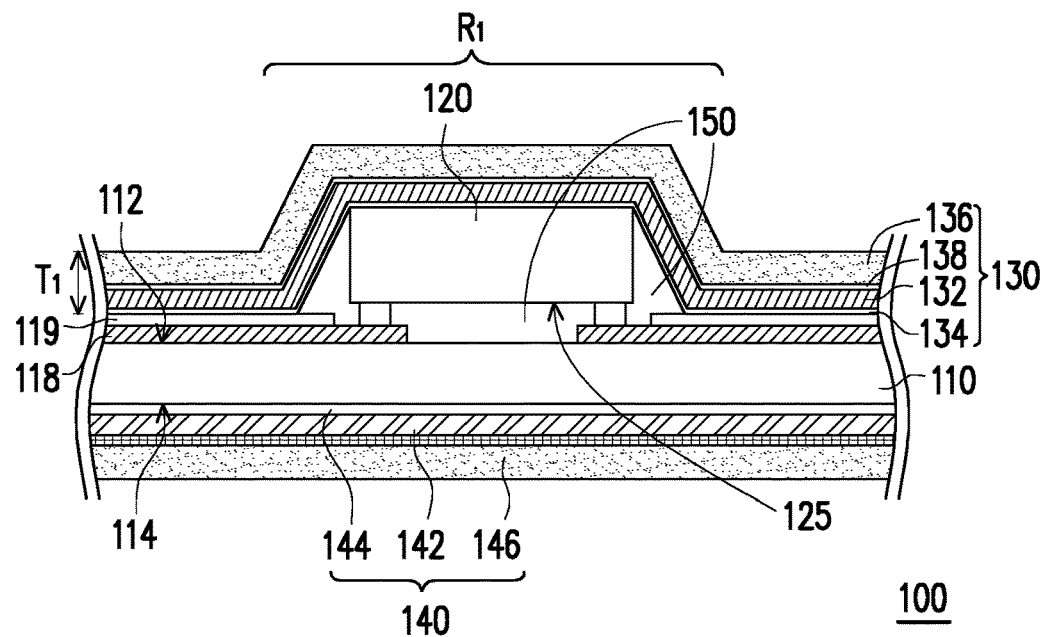
FIG. 8 illustrates a cross-sectional view of a chip on film package according to an embodiment of the disclosure.

FIG. 7 illustrates a top view of a chip on film package according to an embodiment of the disclosure. FIG. 8 illustrates a cross-sectional view of a chip on film package according to an embodiment of the disclosure. It is noted that FIG. 8 is the cross-sectional view of FIG. 7 along line B-B', and the chip on film package shown in FIG. 7 and FIG. 8 contains many features same as or similar to the chip on film package 100 disclosed earlier with FIG. 1 to FIG. 2. For purpose of clarity and simplicity, detail description of same or similar features may be omitted, and the same or similar reference numbers denote the same or like components. The main differences between the chip on film package shown in FIG. 7 and FIG. 8 and the chip on film package 100 shown in FIG. 1 to FIG. 2 are described as follows.

Referring to FIG. 7 and FIG. 8, the heat dissipation sheet 130 covers at least part of an upper surface of the chip 120 and the opening OP1 exposes at least a part of the side surfaces of the chip 120. In detail, the opening OP1 may expose at least a part of two short side surfaces of the chip 120. In the present embodiment, the opening OP1 completely exposes the two short side surfaces of the chip 120. It is noted that the so-called "short side surfaces of the chip 120" means the two side surfaces parallel to the short axis (e.g. axis A2 in FIG. 7) of the chip 120.

In detail, the chip 120 has a chip length L1 along a first axis A1 of the chip 120. A part of the heat dissipation sheet 130 with the opening OP1 has a length L2 along the first axis A1, and another part of the heat dissipation sheet 130 without the opening OP1 has a length L3 along the first axis A1. As such, the length L3 is substantially longer than the length L2, and the length L1 is substantially longer than the length L2. Accordingly, the opening OP1 exposes a part of an upper surface of the chip 120 and the opening OP1 exposes the two short side surfaces of the chip 120 as shown in FIG. 4.

Figure 9:
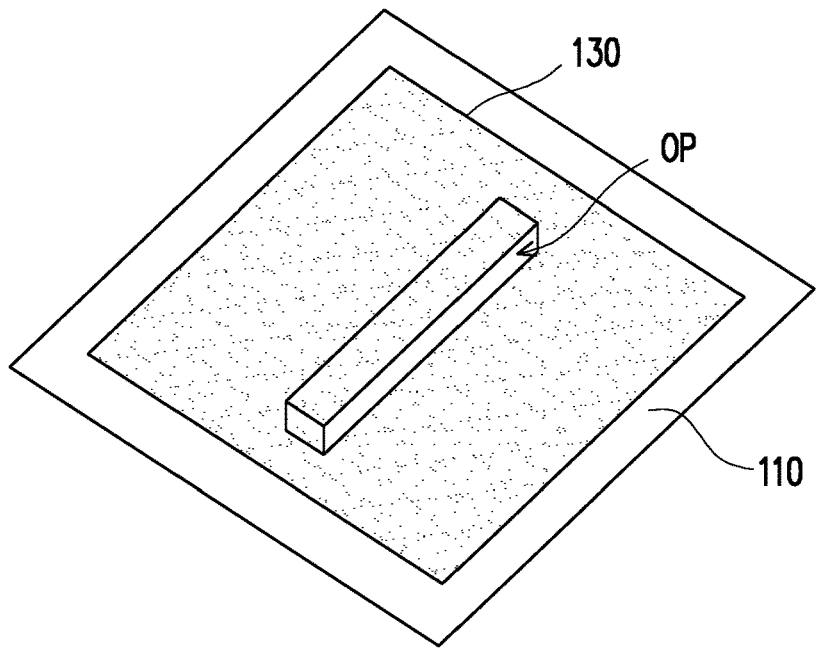
FIG. 9 illustrates a schematic view of a chip on film package according to an embodiment of the disclosure.

FIG. 9 illustrates a schematic view of a chip on film package according to an embodiment of the disclosure. It is noted that the chip on film package shown in FIG. 9 contains many features same as or similar to the chip on film package 100 in the previous embodiments. For purpose of clarity and simplicity, detail description of same or similar features may be omitted, and the same or similar reference numbers denote the same or like components. The main differences between the chip on film package shown in FIG. 9 and the chip on film package 100 in the previous embodiments are described as follows.

Referring to FIG. 9, the heat dissipation sheet 130 may completely cover the upper surface of the chip 120 and the opening OP1 exposes at least a part of the side surfaces of the chip 120. In detail, the opening OP1 may expose at least a part of two long side surfaces of the chip 120. In the present embodiment, the opening OP1 completely exposes the two long side surfaces of the chip 120. It is noted that the so-called "long side surfaces of the chip 120" means the two side surfaces parallel to the long axis (e.g. axis A1 in FIG. 7) of the chip 120.

Figure 10A:
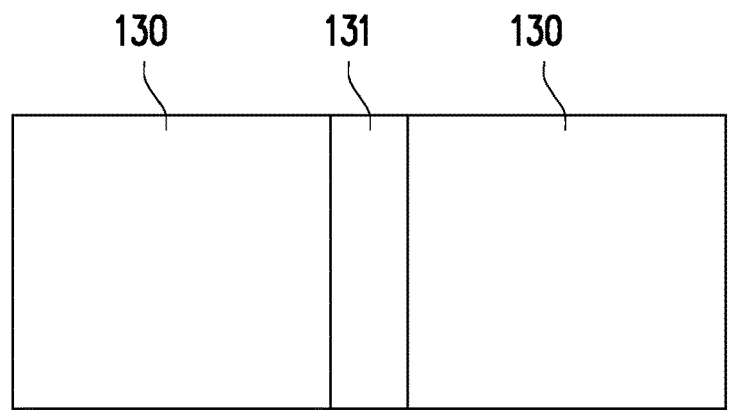
FIG. 10A to FIG. 10C illustrate a part of a manufacturing process of a chip on film packages according to embodiments of the disclosure.
Figure 10B:
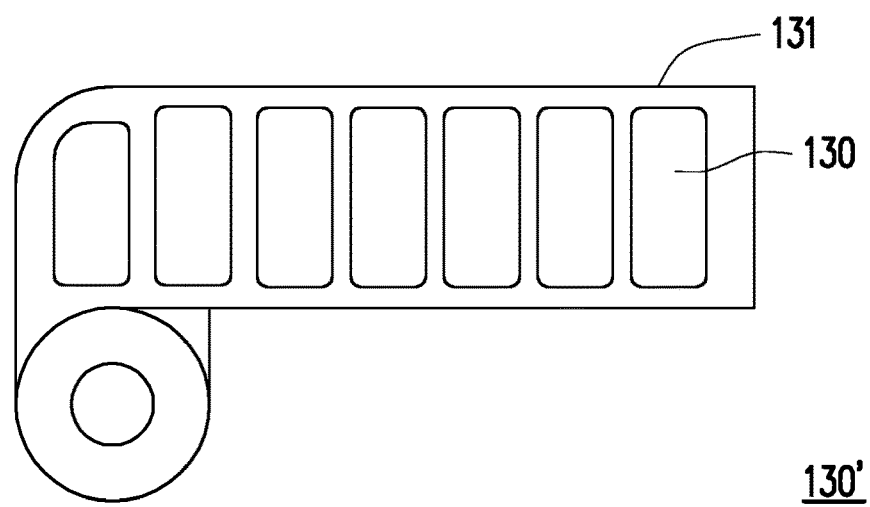
Figure 10C:
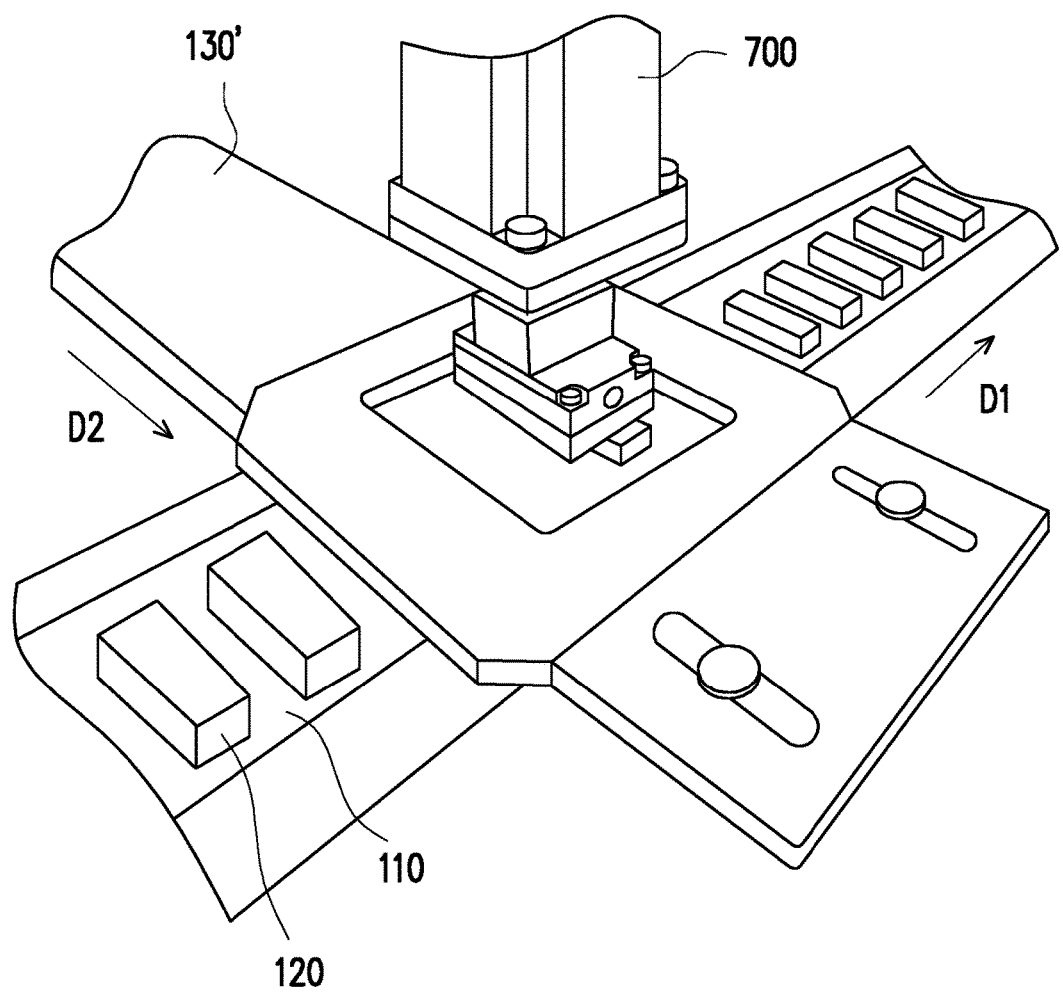
Figure 11:
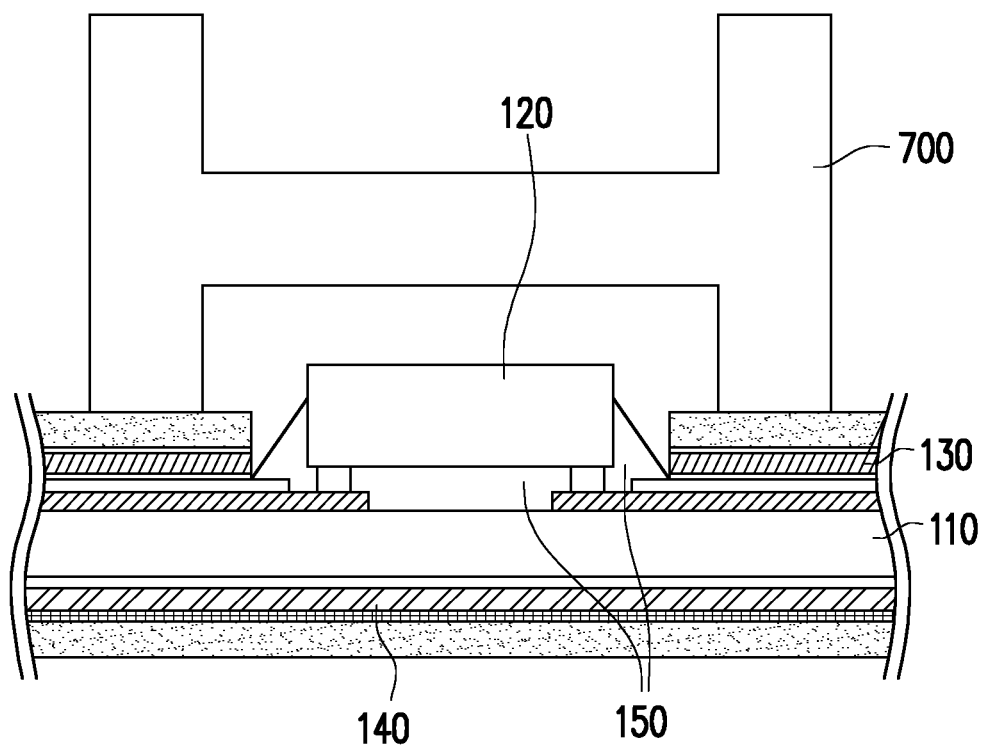
FIG. 11 illustrates an elevation view of a fixture attaching a heat dissipation sheet onto a chip on film package according to an embodiment of the disclosure.

FIG. 10A to FIG. 10C illustrate a part of a manufacturing process of a chip on film packages according to embodiments of the disclosure. FIG. 11 illustrates an elevation view of a fixture attaching a heat dissipation sheet onto a chip on film package according to an embodiment of the disclosure. In the present embodiment, the chip on film package 100 may be formed by a manufacturing method including the following steps. First of all, a heat dissipation roll 130' as shown in FIG. 10A and FIG. 10B is provided. The heat dissipation roll 130' includes a plurality of heat dissipation sheets 130 and a release film 131. The heat dissipation sheets 130 are attached on the release film 131 and each of the heat dissipation sheets 130 includes the opening OP1. In detail, each of the heat dissipation sheets 130 may be similar to the heat dissipation sheet 130/130a/130b/130c shown in FIG. 3 to FIG. 6. The release film 131 may cover an adhesive layer (e.g. the first adhesive layer 134 shown in FIG. 3 to FIG. 6) of the heat dissipation sheets 130.

With such a configuration, the heat dissipation sheets 130 can be connected to each other via the release film 131 to form a heat dissipation sheet belt and the heat dissipation sheet belt can be rolled up to form the heat dissipation roll 130'. Accordingly, the heat dissipation sheets 130 with poor flexibility can be applied to a roll to roll process, so as to be suitable for mass production. Then, the heat dissipation roll 130' is unwound as shown in FIG. 10B, and one of heat dissipation sheets 130 on an unwounded part of the heat dissipation roll 130' may be picked up from the release film 131.

Then, referring to FIG. 10C and FIG. 11, the picked heat dissipation sheet 130 is placed and laminated on a base film 110 by a laminating head 700. In some implementations, a plurality of base films 110 with chips 120 mounted thereon may also be connected to one another and rolled up as a base film roll. The base film roll is then unwound and transmitted along a first direction D1, and the heat dissipation roll 130' with a plurality of heat dissipation sheets 130 is unwound and transmitted along a second direction D2. The first direction D1 and the second direction D2 may be intersected with each other. Accordingly, one of the heat dissipation sheet 130 is placed and laminated on the corresponding base film 110 by the laminating head 700, and the opening (e.g. the opening OP1 shown in FIG. 2) of the corresponding heat dissipation sheet 130 exposes the chip 120 on the corresponding base film 110.

In the present embodiment, the laminating head 700 is a flexible laminating head to avoid unwanted damages to the chip on film package 100. In detail, the laminating head 700 may include a cavity as shown in FIG. 11. Accordingly, when the laminating head 700 presses the heat dissipation sheet 130 onto the base film 110, the chip 120 is located in the cavity without being pressed and damaged. A gap may maintain between the cavity and a side surface of the chip 120 to further prevent the laminating head 700 from damaging the chip 120, and a shortest distance from the cavity to a side surface of the chip 120 is substantially 1 mm to 3 mm.

In sum, in the embodiments of the disclosure, a heat dissipation sheet disposed over the base film of the chip on film package can be utilized for heat dissipation. The heat dissipation sheet has good thermal conductivity and hence leads to an enhanced heat dissipation effect. The heat dissipation sheet includes a graphite layer disposed between two adhesive layers, and at least one of the two adhesive layers is a double-sided adhesive with carrier. With such configuration, heat dissipation sheet provides not only heat dissipation functions but also support to the chip on film package, so as to improve the heat dissipation and reliability of the chip on film package. In addition, an outer edge of the heat dissipation sheet can be aligned with an outer edge of the solder resist layer of the chip on film package to maximize coverage of the heat dissipation sheet and hence heat dissipation effect. With such an arrangement, the contact area between the heat dissipation sheet and the chip on film package can be maximized, so as to improve the heat dissipation of the chip on film package. Moreover, the heat dissipation sheet can include an opening for exposing at least a part of the chip. Accordingly, the air and/or moisture trapped between the chip and the heat dissipation sheet can be easily discharged through the opening, so the heat dissipation sheet would not be deformed or even separated from the chip under high temperature and/or high humidity condition, so as to further improve the reliability of the chip on film package.

Furthermore, in manufacturing processes, a plurality of heat dissipation sheets may be connected to one another via a release film to form a heat dissipation roll. Accordingly, the heat dissipation sheets with poor flexibility can be applied to a roll to roll manufacturing process, such that heat dissipation sheets can be applied to chip on film packages for mass production. Therefore, heat dissipation of the chip on film package in the disclosure can be improved.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A chip on film package, comprising:
   a base film comprising a first surface and a mounting region located on the first surface;
   a patterned circuit layer disposed on the first surface;
   a chip disposed on the mounting region and electrically connected to the patterned circuit layer; and
   a heat dissipation sheet comprising a first adhesive layer disposed over the base film, a second adhesive layer disposed over the first adhesive layer, and a graphite layer disposed between the first adhesive layer and the second adhesive layer, wherein at least one of the first adhesive layer and the second adhesive layer is a double-sided adhesive with carrier, which comprises two adhesives and a carrier disposed between the two adhesives.

2. The chip on film package as claimed in claim 1, wherein each of the first adhesive layer and the second adhesive layer is a double-sided adhesive with carrier.

3. The chip on film package as claimed in claim 1, wherein the first adhesive layer is a double-sided adhesive with carrier, and the second adhesive layer is a double-sided adhesive without carrier, wherein the double-sided adhesive without carrier comprises an adhesive without comprising any carrier.

4. The chip on film package as claimed in claim 1, wherein the first adhesive layer is a double-sided adhesive without carrier, and the second adhesive layer is a double-sided adhesive with carrier, wherein the double-sided adhesive without carrier comprises an adhesive without comprising any carrier.

5. The chip on film package as claimed in claim 1, wherein a material of the two adhesives comprises high temperature acrylic adhesive.

6. The chip on film package as claimed in claim 1, wherein a material of the carrier comprises polyethylene terephthalate (PET) or polyimide (PI).

7. The chip on film package as claimed in claim 3, wherein a material of the adhesive comprises high temperature acrylic adhesive.

8. The chip on film package as claimed in claim 4, wherein a material of the adhesive comprises high temperature acrylic adhesive.

9. The chip on film package as claimed in claim 1, wherein the heat dissipation sheet further comprises a protection layer disposed on the second adhesive layer.

10. The chip on film package as claimed in claim 9, wherein the protection layer is an insulating film.

11. The chip on film package as claimed in claim 10, wherein a material of the insulating film comprises polyimide (PI).

12. The chip on film package as claimed in claim 1, wherein a thickness of the heat dissipation sheet substantially ranges from 17 μm to 20 μm.

13. The chip on film package as claimed in claim 1, further comprising:
   a solder resist layer partially covering the patterned circuit layer and disposed between the patterned circuit layer and the heat dissipation sheet.

14. The chip on film package as claimed in claim 13, wherein the heat dissipation sheet covers at least a part of the solder resist layer and an outer edge of the heat dissipation sheet is substantially aligned with an outer edge of the solder resist layer.

15. The chip on film package as claimed in claim 13, wherein the heat dissipation sheet is attached to the solder resist layer by the first adhesive layer.

16. The chip on film package as claimed in claim 1, wherein the heat dissipation sheet further comprises an opening exposing at least a part of the chip.

17. The chip on film package as claimed in claim 16, wherein the opening completely exposes an upper surface and a plurality of side surfaces of the chip.

18. The chip on film package as claimed in claim 16, wherein the heat dissipation sheet covers at least a part of an upper surface of the chip and the opening completely exposes two side surfaces of the chip.

19. The chip on film package as claimed in claim 16, wherein the opening exposes at least a part of a plurality of side surfaces of the chip.

20. The chip on film package as claimed in claim 16, wherein the opening exposes at least a part of two short side surfaces of the chip.

21. The chip on film package as claimed in claim 16, wherein the opening exposes at least a part of two long side surfaces of the chip.

22. The chip on film package as claimed in claim 1, wherein the heat dissipation sheet layer completely covers an upper surface of the chip.

23. The chip on film package as claimed in claim 16, wherein the opening completely exposes an upper surface of the chip.

24. The chip on film package as claimed in claim 16, wherein the opening of the heat dissipation sheet exposes a part of the patterned circuit layer extended to the mounting region.

25. The chip on film package as claimed in claim 16, further comprising an underfill filled between the chip and the base film, and the opening exposing the underfill.

26. The chip on film package as claimed in claim 16, wherein a gap exists between the opening and a side surface of the chip.

27. The chip on film package as claimed in claim 26, wherein a width of the gap is equal to or longer than 2 mm.

28. The chip on film package as claimed in claim 1, further comprising a back heat dissipation sheet disposed on a second surface of the base film opposite to the first surface of the base film.

29. The chip on film package as claimed in claim 28, wherein the back heat dissipation sheet is overlapped with at least the mounting region from a top view of the chip on film package.

30. The chip on film package as claimed in claim 28, wherein an outer edge of the back heat dissipation sheet is substantially aligned with the outer edge of the heat dissipation sheet.

* * * * *